(12) United States Patent
Yang

(10) Patent No.: US 6,677,784 B2
(45) Date of Patent: Jan. 13, 2004

(54) LOW VOLTAGE BIPOLAR LOGIC AND GATE DEVICE

(75) Inventor: Jungwook Yang, West Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 09/752,572

(22) Filed: Dec. 28, 2000

(65) Prior Publication Data

US 2002/0084806 A1 Jul. 4, 2002

(51) Int. Cl.[7] .............................................. H03K 19/086
(52) U.S. Cl. ..................................... 326/127; 326/126
(58) Field of Search ................................. 326/124, 126, 326/127, 128–130

(56) References Cited

U.S. PATENT DOCUMENTS

| | | | | |
|---|---|---|---|---|
| 5,289,055 A | * | 2/1994 | Razavi ......................... | 326/126 |
| 5,828,237 A | * | 10/1998 | Keating ....................... | 326/126 |
| 6,114,874 A | * | 9/2000 | Bales .......................... | 326/66 |
| 6,137,335 A | * | 10/2000 | Proebsting ................... | 327/281 |
| 6,222,391 B1 | * | 4/2001 | Fujita et al. ................. | 326/126 |
| 6,265,901 B1 | * | 7/2001 | stern et al. ................... | 326/126 |
| 6,346,904 B1 | * | 2/2002 | Gaillard et al. .............. | 341/136 |

* cited by examiner

Primary Examiner—Don Le
(74) Attorney, Agent, or Firm—Scully, Scott, Murphy & Presser; Thu Ann Dang, Esq.

(57) ABSTRACT

A single stack bipolar logic AND gate for low power applications comprising: a first differential pair of transistors, each transistor of the first differential pair having base, emitter and collector terminals, a base of a first transistor of the first differential pair receiving an input signal A and a base of the second transistor of the first differential pair receiving its complement signal $\bar{A}$, the emitters of each transistor of the first differential pair being connected at a common node to a first constant current source; a second differential pair of transistors, each transistor of the second differential pair having base, emitter and collector terminals, a base of a first transistor of the second differential pair receiving an input signal B and a base of the second transistor of the second differential pair receiving its complement signal $\bar{B}$, the emitters of each transistor of the second differential pair being connected at a common node to a second constant current source; and, a common voltage power supply source, the collector terminal of each first transistor of the first and second differential pairs being connected to the common voltage power supply source through a first resistance and defining a complement output node of the AND gate, and the collector terminal of each second transistor of the first and second differential pair being connected to the common voltage power supply source through a second resistance and additionally defining an output node of the AND gate, wherein the second resistance is greater than the first resistance.

25 Claims, 8 Drawing Sheets

Vcc
Vcc-IR1
Vcc-2IR1
Vcc-3IR1
Vcc-IR2
Vcc-2IR2
Vcc-3IR2

FIG. 8B-3

DIFFERENTIAL
OUTPUT VOLTAGE

DIFFERENTIAL OUTPUT VOLTAGE

FIG. 10

LOW VOLTAGE BIPOLAR LOGIC AND GATE DEVICE

BACKGROUND OF THE INVENTION

1. Field of the Invention

The present invention relates generally to electronic circuits, and more specifically to an integrated circuit AND gate and related logic devices using either bipolar emitter coupled logic (ECL) or current mode logic (CML) devices, or both, implementing only a single low-voltage supply source for integration with CMOS logic circuits.

2. Description of the Prior Art

Figure 1:
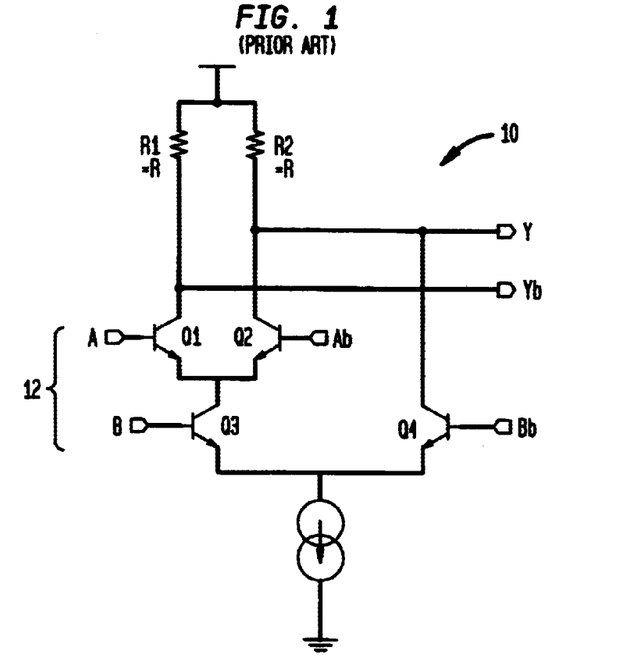
FIG. 1 is a circuit diagram depicting a CML logic AND gate 10 having a stacked the differential stage arrangement 12 according to the prior art.

The ECL (emitter coupled logic) and CML (current mode logic circuits) are the fastest logic family in bipolar transistor technology. The operation of the bipolar CML and ECL digital gates is fast because they operate in a manner such as to avoid the saturation of their transistors. As shown in FIG. 1, there is illustrated a circuit diagram of a CML logic AND gate 10 having a stacked differential stage arrangement 12 according to the prior art. As known, CML logic implementing such stacked stage configurations require a comparably high supply voltage, typically above 3V in the latest technology.

For high-speed wired and wireless communication systems, high-speed ECL and CML circuits are integrated with high-density CMOS (complementary metal-oxide semiconductor) circuit in one chip. As CMOS transistors scale down for high-speed and high-integration, the supply voltage also scales down, but the bipolar circuits do not. This is because the supply voltage of the logic is high due to the stacked differential stages. Consequently, the system needs two supply voltage sources, one for bipolar circuit with high voltage, and the other for CMOS circuit with low voltage, which is not always desirable, especially for portable systems.

Razavi, as described in U.S. Pat. No. 5,289,055 and Razavi, et al. as described in the reference entitled "Design Techniques for Low-Voltage High-Speed Digital Bipolar Circuits" IEEE Journal of Solid-State Circuits, Vol. 29, No. 3, pp. 332–339, March 1994, has recognized use of bipolar ECL that avoids stacked differential stages for multiplexor, latch and XOR logic gates in low supply voltage applications, however, does not implement an AND function. G. Schuppener, et al. in the reference "Investigation on Low-Voltage, Low-Power Silicon Bipolar Design Topology for High-Speed Digital Circuits" IEEE Journal of Solid-State Circuits, Vol. 35, No. 7, pp. 1051–1054, July 2000, describes a CML frequency divider circuit with the circuit structure described in the Razavi references. The circuits described in Razavi and Schuppener, et al., however, do not require an AND logic gate.

It is the case that an AND gate is essential for all kinds of digital system designs, and also, low voltage systems, e.g., for portable applications.

It would thus be highly desirable to provide a low-supply voltage AND gate implemented for mix of bipolar-CMOS logic gates operable under one low-voltage supply source.

It would be further highly desirable to provide an ECL and CML logic AND gate that works under low supply voltage and preferably, that operates at voltages at or lower than the supply voltage used in for the latest CMOS technology.

SUMMARY OF THE INVENTION

It is an object of the present invention to provide a high-speed ECL and CML logic AND gate and related devices that operates under low supply voltages and preferably, operates at voltages at or lower than the supply voltage used in current CMOS technology.

It is a further object of the present invention to provide a high-speed ECL and CML logic AND gate and related logic devices operable with a single low-voltage power source and capable of integrating with CMOS logic devices for high-speed, low power electronic systems.

According to the invention, there is provided a single stack bipolar logic AND gate for low power applications comprising:

a first differential pair of transistors, each transistor of the first differential pair having base, emitter and collector terminals, a base of a first transistor of the first differential pair receiving an input signal A and a base of the second transistor of the first differential pair receiving its complementary signal $\overline{A}$, the emitters of each transistor of the first differential pair being connected at a common node to a first constant current source;

a second differential pair of transistors, each transistor of the second differential pair having base, emitter and collector terminals, a base of a first transistor of the second differential pair receiving an input signal B and a base of the second transistor of the second differential pair receiving its complementary signal $\overline{B}$, the emitters of each transistor of the second differential pair being connected at a common node to a second constant current source; and, a common voltage power supply source, the collector terminal of each first transistor of the first and second differential pairs being connected to the common voltage power supply source through a first resistance and defining a complement output node of the AND gate, and the collector terminal of each second transistor of the first and second differential pair being connected to the common voltage power supply source through a second resistance and additionally defining an output node of the AND gate, wherein the second resistance is greater than the first resistance.

Specifically, a single-stack AND gate of ECL and CML (current mode logic) systems is provided that may operate under very low supply voltage, e.g., as low as 1V supply. With this invention, the high-speed bipolar CML logic can be operated with low voltage CMOS logic circuits under the same low supply voltage.

Advantageously, the invention is suitable for high-speed front-end of wireless transceivers such as frequency synthesizer, especially the multi-modulus frequency divider, however may be implemented in many types of high frequency circuit applications, or, any ECL or CML system requiring low voltage applications.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which:

FIGS. 8(b)(1)–8(b)(3) illustrate the various input logic values 90 for the three-input AND gate (FIG. 8(b)(1)), including relative complementary output voltage values 92 at Y and Yb (FIG. 8(b)(2)) for each of the truth table logic input combinations and, the corresponding differential output voltage values 94 as shown in FIG. 8(b)(3)).

FIGS. 9(b)(1) and 9(b)(2) illustrates the output signal diagram for the circuit of FIG. 9(a).

DETAILED DESCRIPTION OF THE INVENTION

Figure 2:
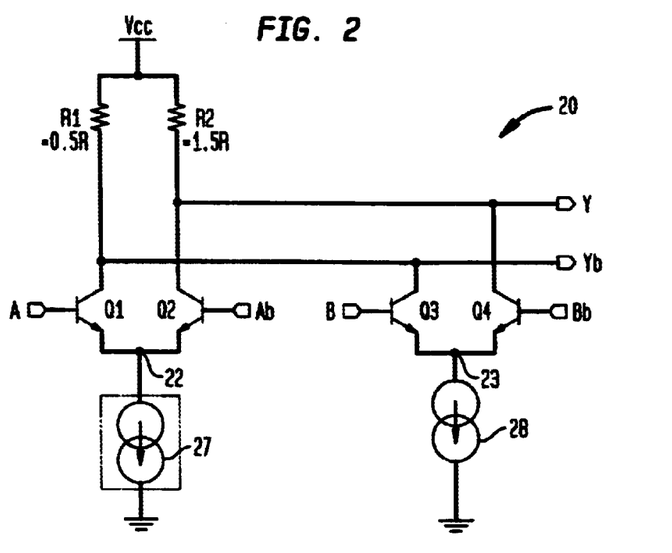
FIG. 2 illustrates the schematic diagram of an example bipolar logic (CML, ECL) gate according to the invention.

This present invention implements a low voltage AND gate in bipolar technology (e.g., implementing CML, EML and the like) without stacking the differential stages. FIG. 2 illustrates a schematic diagram of an example logic AND gate 20 implementing CML bipolar technology. As shown in FIG. 2, the circuit includes a single differential stage comprising transistors Q1 and Q2 forming a first differential pair having inputs A and its complement $\overline{A}$ (hereinafter "Ab") respectively connected to respective transistor bases and, second transistors Q3 and Q4 forming a second differential pair having inputs B and its complement $\overline{B}$ (hereinafter "Bb") respectively connected to respective transistor bases.

Figure 2A:
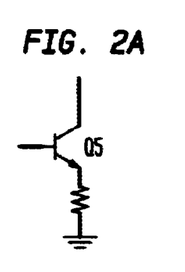
FIG. 2a is an exemplary circuit depiction of a constant current source of FIG. 2.

The emitters of Q1 and Q2 of the first differential pair are both connected at a common node 22 to a constant current source 27 while emitters of Q3 and Q4 of the second differential pair are both connected to a common node 23 at which a constant current source 28 is derived. FIG. 2a is an exemplary circuit depiction of a constant current source 27' comprising a transistor Q5. By applying appropriate voltages at Vref transistor base, the current level is determined.

Referring back to FIG. 2, the collectors of each of transistors Q1 and Q2 are connected to a common voltage supply of Vcc through respective resistance elements R1 and R2. Likewise, the collectors of each of transistors Q3 and Q4 are connected to the common voltage supply of Vcc through respective resistance elements R1 and R2. In the preferred embodiment, the resistance of R2 is greater than that of R1 with the value of R1 preferably being equal to 0.5R while the value of R2 being equal to 1.5R for optimum output logic value resolution. It is understood however, that the resistance for R1 may be 0.4R while the resistance for R2 may be 1.6R for example which would result in different differential output voltage. A typical power supply voltage may be 3.0 V. As known, typical CML or ECL values may range from 1.5 V–3.0 V of A, e.g., 2.0 V. If a logic 1 (logic "high") is represented, the input voltage value at A is greater than the input voltage value at Ab. Thus, when representing a logic 1, input A may be 2.0 V, while input Ab may be 1.5 V, for example. If a logic 0 (logic "low") is represented, the input voltage value at A is less than the input voltage value at Ab. Thus, when representing a logic 0, input A may be 1.5 V, while input Ab may be 2.0 V. The foregoing logic values for A and Ab also holds for logic values at B and Bb inputs, although, the voltage values may be lower due to the physical layout of the circuitry. Thus, when representing a logic 1, input B may be 1.5 V, while input Bb may be 1.0 V, for example, while for a logic 0, the input voltage value at B may be 1.0 V and Bb may be 1.5 V, for example. The complementary voltage outputs of the AND gate 20 are Y and $\overline{Y}$ (hereinafter "Yb") with the output Y connected to the collectors of transistors Q2 and Q4 and the output Yb connected to the collectors of Q1 and Q3. In accordance with differential logic, the output is a logic 1 when Y is greater than Yb.

In an example circuit assuming a Vcc supply voltage of 3.0 V, a resistance value R=500 ohms (making R1=250 Ω and R2=750 Ω) and, each constant current supply source being 1 mA, for example, it is readily seen that when A=B=Logic 1, then B>Bb and Q3 is on and Q4 is off while A>Ab rendering transistor Q1 on and transistor Q2 off. Thus very little current is drawn through Q2 and Q4 with most of the current, i.e., about 2.0 mA, being drawn to transistors Q1 and Q3 through resistor R1. This results in an output Y>Yb, with example values being Yb at 2.5 volts and Y at the supply voltage, e.g., 3.0 V (no voltage drop through R2), thus rendering the output a logic 1. Continuing along with the logic, if A=B=Logic 0, then Bb>B and Q3 is off and Q4 is on while Ab>A rendering transistor Q1 off and transistor Q2 on. Thus very little current is drawn through Q1 and Q3 with most of the current, i.e., about 2.0 mA, being drawn through transistors Q2 and Q4 through resistor R2. This results in an output Y<Yb, with example values being Y at 1.5 volts and Yb at the supply voltage, e.g., 3.0 V (no voltage drop through R1), thus rendering the output a logic 0.

Figure 3A:
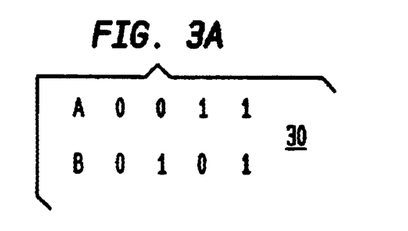
FIGS. 3(a)–3(c) illustrate the logic truth table 30 for the bipolar logic AND gate (FIG. 3(a)) of FIG. 2, including relative complementary output voltage values at Y and Yb (FIG. 3(b)) for each of the truth table logic input combinations and, the differential output voltage values (Y–Yb) (FIG. 3(c)).
Figure 3B:
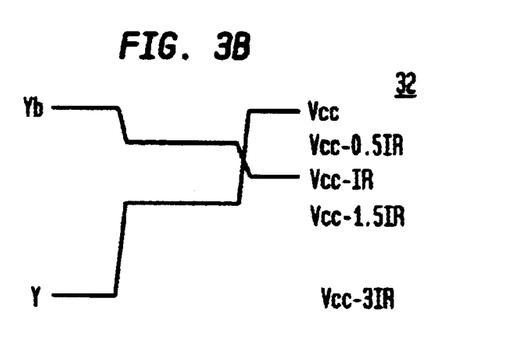
Figure 3C:
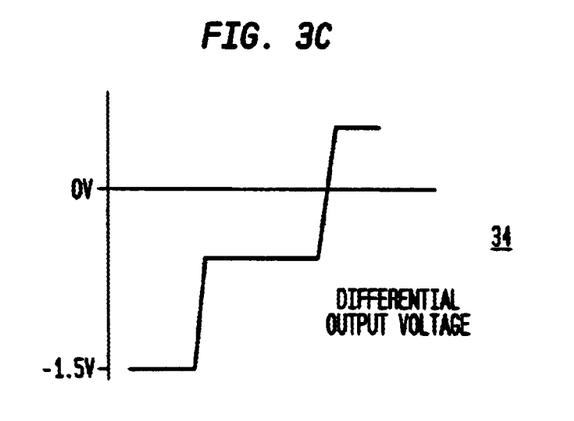

FIGS. 3(a)–3(c) illustrate the various input logic values 30 for the AND gate (FIG. 3(a)) of FIG. 2, including relative complementary output voltage values 32 at Y and Yb (FIG. 3(b)) for each of the truth table logic input combinations and, the differential output voltage values 34 (i.e., Y–Yb for each of the truth table logic input combinations) as shown in FIG. 3(c)). As shown in FIG. 3(b), the output Y is higher than Yb only when both A=B=1 (are logic high). Typically, the I*R voltage drop is designed around 300 mV~400 mV in CML circuits.

Figure 4:
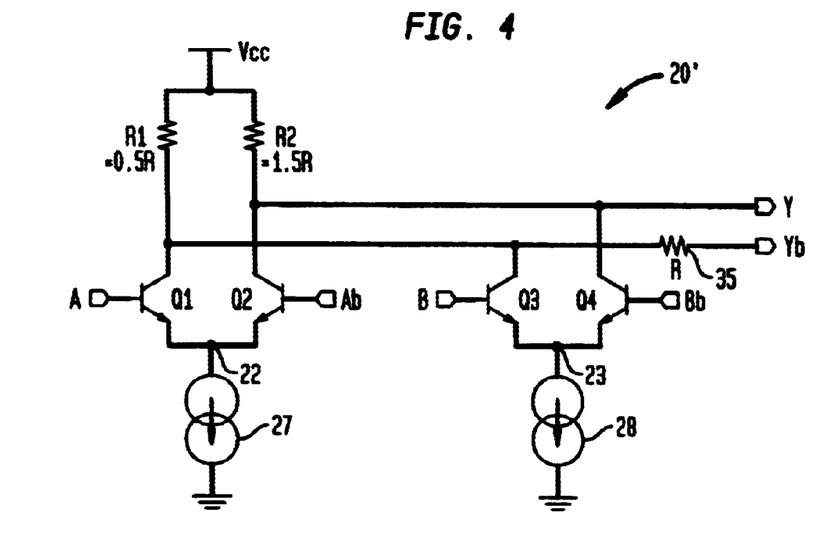
FIG. 4 illustrates the circuit 20' corresponding the circuit 20 of FIG. 2 having balanced output resistance.

As the output load resistance is different, the driving capability and rise time will be different, i.e., unbalanced. FIG. 4 illustrates the circuit 20' corresponding the circuit 20 of FIG. 2. In the circuit of FIG. 4, a resistor 35 of a value R is placed between output node Yb and the input of the next gate as shown in FIG. 4 to result in the output resistance being the same. There will be virtually no voltage drop across resistor 35 as the input impedance of the succeeding stage is very high.

Figure 5A:
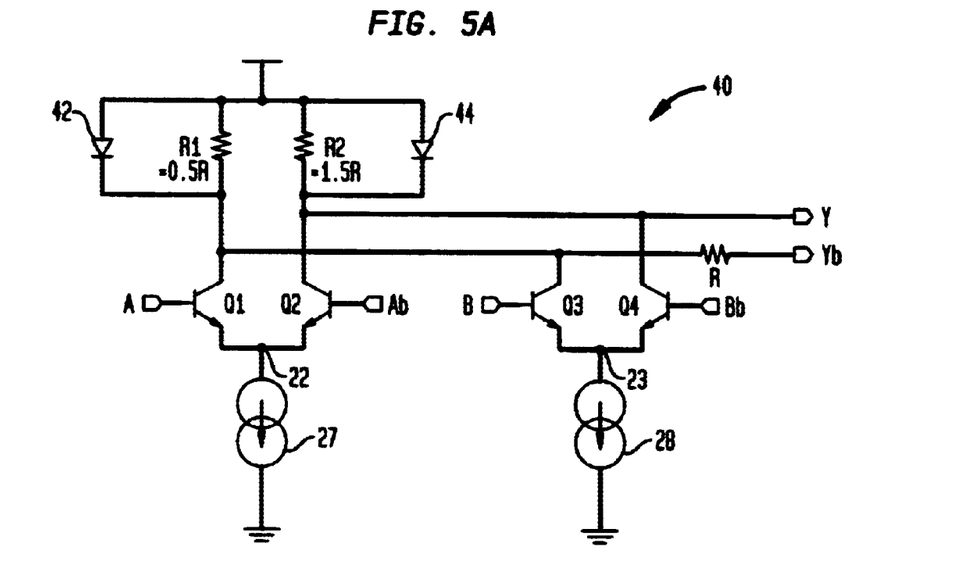
FIGS. 5(a) and 5(b) illustrate alternate embodiments of the single stack bipolar logic AND gate arrangement according to the present invention that are applicable for low-voltage power supply sources FIGS. 5(c)(1)–5(c)(3) illustrate the logic truth table 50 for the bipolar logic AND gates (of FIGS. 5(a) and 5(b)), including relative complementary output voltage values at Y and Yb (FIG. 5(c)(2)) for each of the truth table logic input combinations and, the differential output voltage values (Y–Yb) (FIG. 5(c)(3)).
Figure 5B:
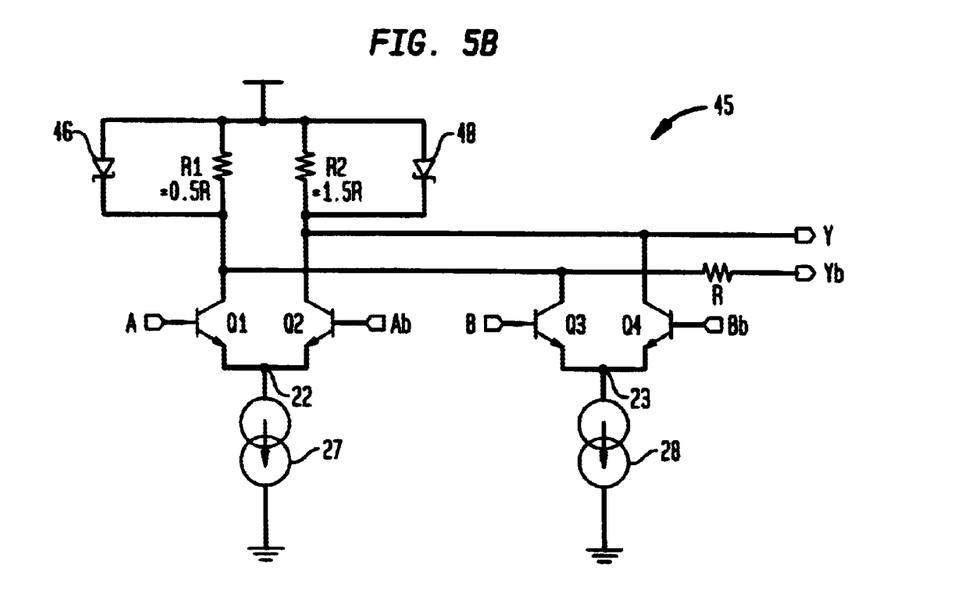
Figure 5C:
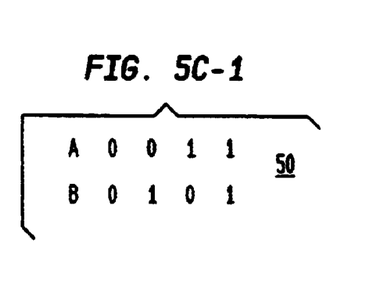
Figure 5C:
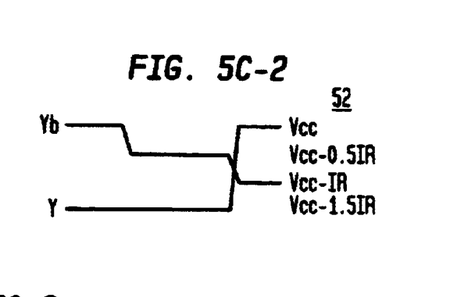
Figure 5C:
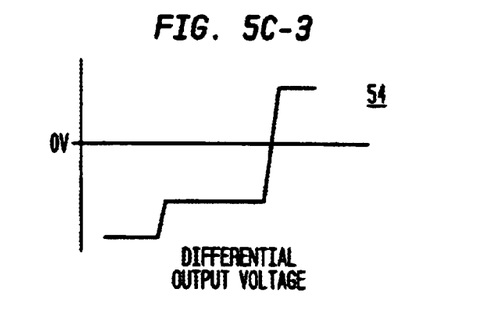

FIGS. 5(a) and 5(b) illustrate alternate embodiments of the single stack bipolar logic AND gate arrangement 40 according to the present invention that are applicable for low-voltage power supply sources, e.g., Vcc equal to about 1.2 V or 1.5 Volts. In the design shown in FIG. 5(a), forward biased p-n junction diodes 42, 44 are connected in parallel across respective resistors R1, R2 to function as clamping devices for limiting the voltage swing at the output nodes Y and Yb. In FIG. 5(b) there is shown an implementation of forward biased schottky diodes 46, 48 connected in parallel across respective resistors R1, R2 to function as clamping devices for limiting the voltage swing at the output nodes Y and Yb of the AND gate 45. That is, the voltage drops across the resistors R1, R2 are clamped to the turn-on voltages of the respective p-n diode (e.g., 0.6 V~0.9 V) or schottky diodes (e.g., 0.4 V~0.5 V). This prevents saturation of the input transistor Q1 and Q3 when both inputs A and B are both logic "low" values, and a low voltage supply is used. That is, for logic A=B=0, as shown in FIG. 3(b), as the complementary output voltage value at node Y is reduced by an amount −3R·I from Vcc, under low voltage supply, it will saturate the input transistor Q1 and Q3. To avoid this saturation effect, the Y and Yb output swings are clamped with a p-n junction diode, or preferably, a schottky diode, which has lower turn-on voltage than p-n junction diode as shown in FIGS. 5(a) and 5(b). FIGS. 5(c)(1)–5(c)(3) illustrate the various input logic combinations 50 for the single stack bipolar logic AND gate arrangement (FIG. 5(c)(1)) having clamped output voltages, including relative complementary output voltage values 52 at Y and Yb (FIG. 5(c)(2)) for each of the logic input combinations and, the differential output voltage values 54 (i.e., Y−Yb for each of the logic input combinations) as shown in FIG. 5(c)(3)). As shown, the output voltage swing at Y is lower for the case of differential inputs A=B=0 as compared to the unclamped outputs depicted in FIG. 3(b) for the AND gate circuit of FIG. 2.). It should be understood that, by using this AND gate implementation, the logic circuits may work under as low as or lower than 1.0V supply depending upon the bias condition.

Figure 6A:
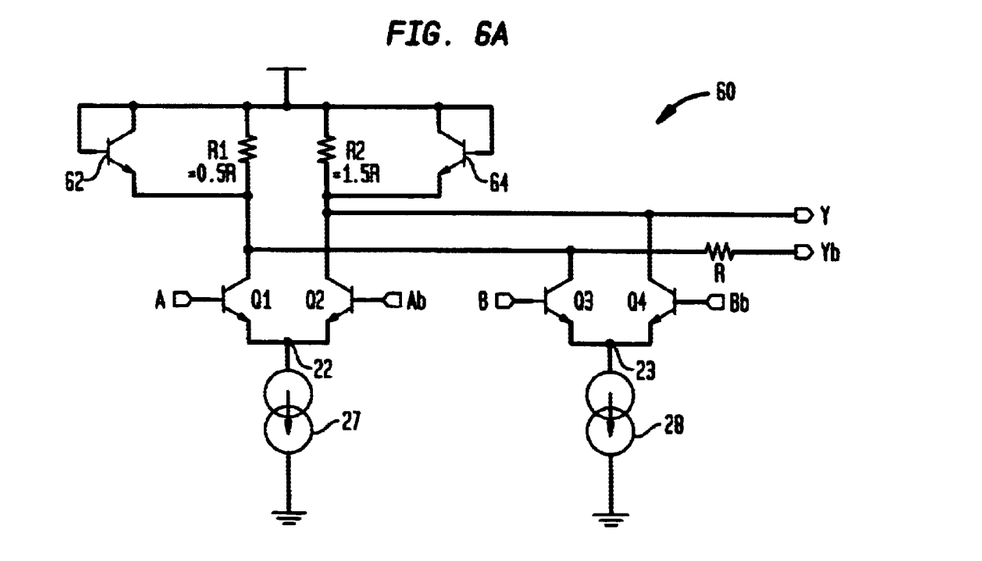
FIG. 6(a) illustrates a single stack bipolar logic AND gate arrangement 60 having base-emitter junctions of respective bipolar transistors used as the clamping functions across respective resistors R1, R2.
Figure 6B:
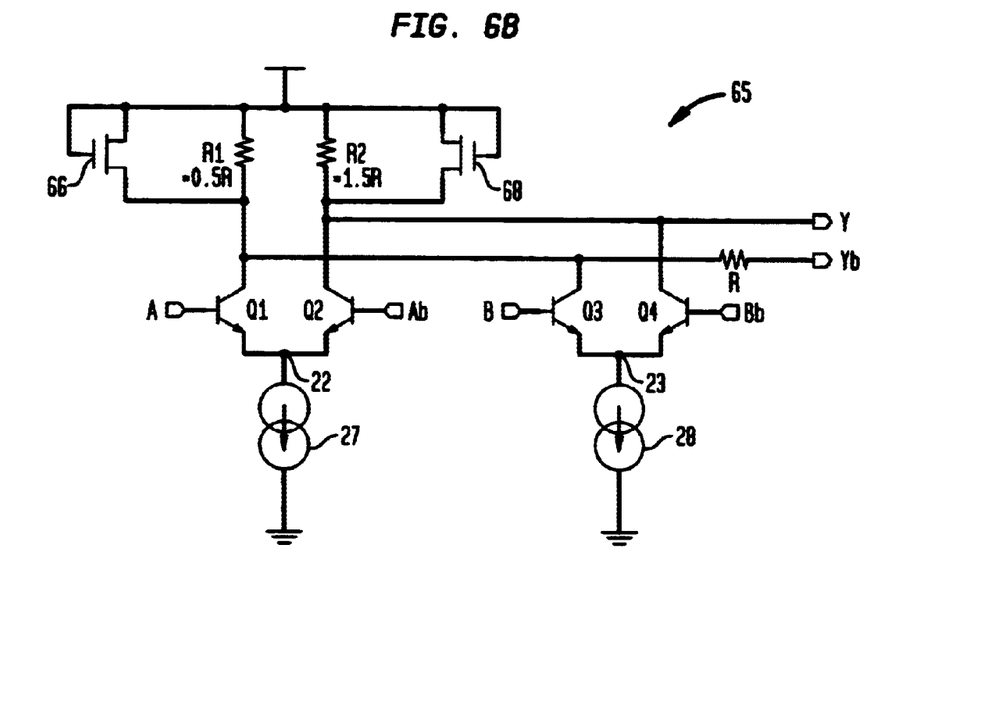
FIG. 6(b) illustrates a single stack bipolar logic AND gate arrangement 65 having gate-source junctions of respective NMOS transistors 66, 68 used as the clamping function across respective resistors R1, R2.

As shown in FIG. 6(a), and, in accordance with the embodiments depicted in FIG. 5(a), base-emitter junctions of bipolar transistors 62, 64 may be used for the clamping function across respective resistors R1, R2 in the single stack bipolar logic AND gate arrangement 60. In FIG. 6(b), the gate-source voltages of NMOS transistors 66, 68 are used for the clamping function across respective resistors R1, R2 in the single stack bipolar logic AND gate arrangement 65. These arrangements additionally enable reduced output voltage swings for implementation in low-power supply voltage applications. As mentioned, in FIGS. 5(a) and 6(a), the forward biased voltage drop of the forward biased p-n junction is around 0.6V~0.9V in the nominal condition, which is still large enough to saturate the respective input transistors. In this case, lowering the common mode input signal level A, Ab, B, and Bb will act to prevent the input transistors from working in saturation region.

Figure 7:
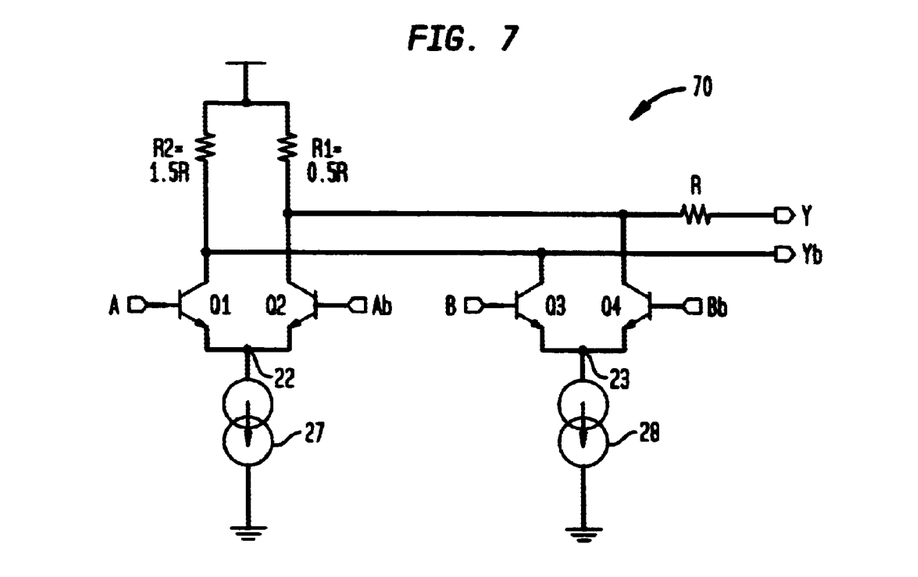
FIG. 7 illustrates a single stack bipolar logic OR arrangement 70 designed in accordance with the principles of the invention.

FIG. 7 illustrates a single stack bipolar logic OR arrangement 70 designed in accordance with the principles of the invention. As shown in FIG. 7, the OR gate 70 may be implemented by swapping the load resistors R1 and R2, as compared to the AND gate configuration of FIG. 2, which is inherent in Boolean logic with differential configuration. That is, the Boolean logic for an AND function is $Y=A \times B$, where x denotes the AND function. Thus, $\overline{Y}=\overline{A \times B}=\overline{A}+\overline{B}$; and, hence, $\overline{Y}=\overline{A \times B}=\overline{A}+\overline{B}$. From this, the AND logic function may be made by inverting both of the inputs and output. In the differential logic functions, inverting is made by swapping the signal and the complementary signal. The topology of the OR gate in FIG. 7 has R1 and R2 swapped such that the inputs A and Ab and B and Bb, and the output Y and Yb are effectively swapped.

Figure 8A:
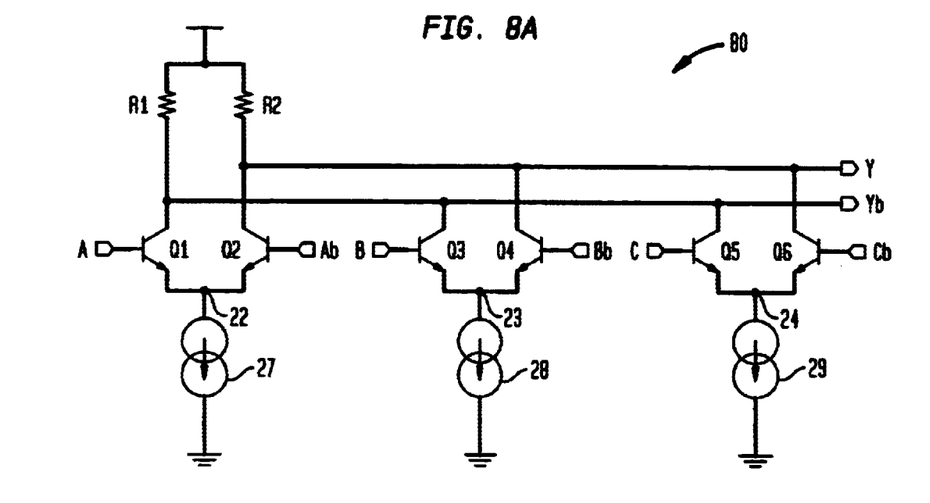
FIG. 8(a) illustrates a schematic diagram for a single stack bipolar logic three-input AND gate 80 designed in accordance with the principles of the invention.
Figure 8B:
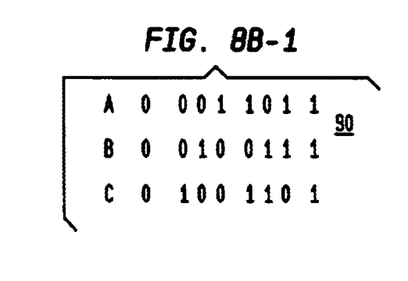
Figure 8B:
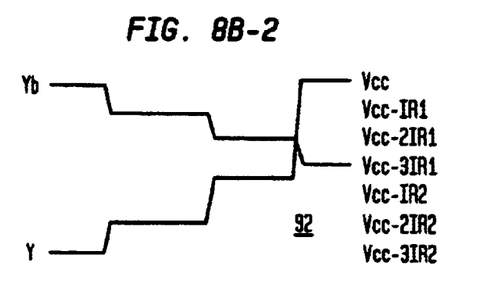
Figure 8B:
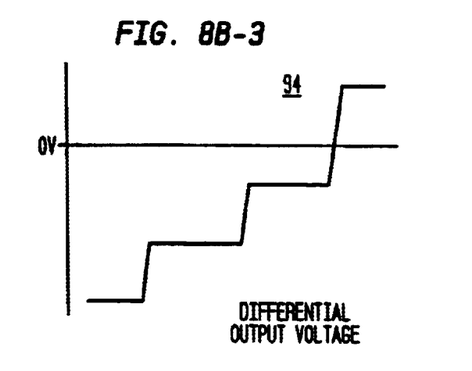

In accordance with the principles of the invention, single stack bipolar logic multi-input AND gates may be designed. FIG. 8(a) illustrates a schematic diagram for a three-input AND gate 80, with the output waveform illustrated in FIGS. 8(b)(1)–8(b)(3). In the embodiment of FIG. 8(a), the output resistors are the same values as the two-input AND gate of FIG. 2. Included in the three input arrangement is the addition of a third set of transistors Q5 and Q6 forming a third differential pair having inputs C and its complement $\overline{C}$ (hereinafter "Cb") respectively connected to respective transistor bases. The emitters of Q5 and Q6 of this third differential pair are both connected at a common node 24 to a constant current source 29 while the collectors of each of transistors Q5 and Q6 are connected to the common voltage supply of Vcc through respective resistance elements R1 and R2. In the preferred embodiment, the resistance of R2 is bigger than that of R1 with the value of R1. FIGS. 8(b)(1)–8(b)(3) illustrate the various input logic values 90 for the three-input AND gate (FIG. 8(b)(1)), including relative complementary output voltage values 92 at Y and Yb (FIG. 8(b)(2)) for each of the truth table logic input combinations and, the differential output voltage values 94 (i.e., Y−Yb for each of the truth table logic input combinations) as shown in FIG. 8(b)(3)). As shown in FIG. 8(b)(2), the output Y is higher than Yb only when all three inputs A=B=C=1 (are logic high).

Figure 8C:
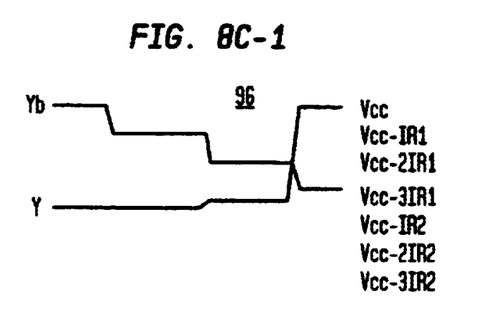
Figure 8C:
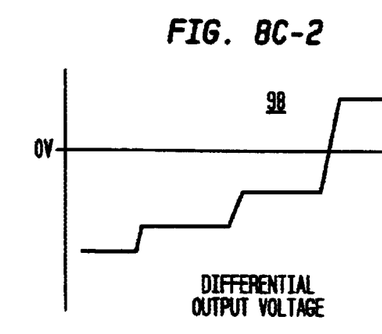

FIGS. 8(c)(1)–8(c)(2) illustrate the resulting relative complementary output voltage values 96 at Y and Yb waveforms when output clamping is utilized for the three-input AND gate in accordance with the principles of the invention and, the differential output voltage values 98 (i.e., Y−Yb for each of the truth table logic input combinations) thereof. It is understood that the same implementation is applicable to single stack bipolar logic n-input (n>3) AND gates, and furthermore, may be extended to designs of single stack bipolar logic n-input (n>3) OR gates.

Figure 9A:
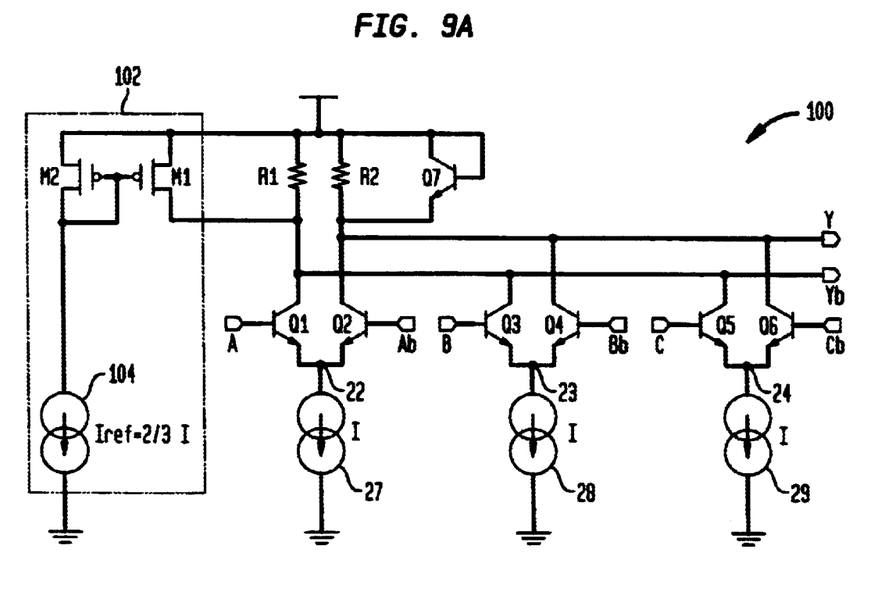
FIG. 9(a) illustrates a schematic diagram for a single stack bipolar logic three-input AND gate 100 implementing clamping circuits with a current source supplying current to the transistors Q1, Q3 and Q5 up to a reference current value, Iref.
Figure 9B:
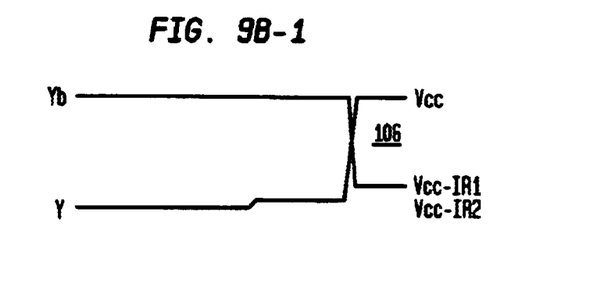
Figure 9B:
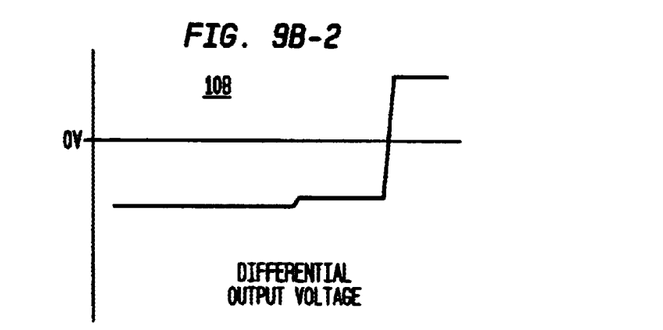

As shown in FIGS. 8(c)(1) and 8(c)(2), both Y and Yb outputs are clamped, but as Yb is at the less resistance load side, its output level reduces until it approaches the clamping level. As a result, the differential output voltage swing is reduced. To correct this, a current source 102 may be inserted across resistance R1 of the single stack bipolar logic multi-input AND gate 100 as shown in FIG. 9(a). As shown in FIG. 9(a), this current source supplies current to the transistors Q1, Q3 and Q5 up to a reference current value, Iref 104, which the current source 102 is biased from. Hence, up to the current of Iref, the current source transistors M1 and M2 will supply the current to transistors Q1, Q3 and Q5 so that R1 does not have to supply current to them. Until that point, Yb will remain at Vcc as shown in FIGS. 9(b)(1) and 9(b)(2) which illustrates the signal diagram for the circuit in FIG. 9(a). Thus, as shown in FIGS. 9(b)(1) and 9(b)(2), the resulting relative complementary output voltage values 106 at Y and Yb waveforms are relatively flat when output clamping is implemented for the three-input AND gate 100 of FIG. 9(a) with a current source circuit 102 supplied across R1.

Figure 10:
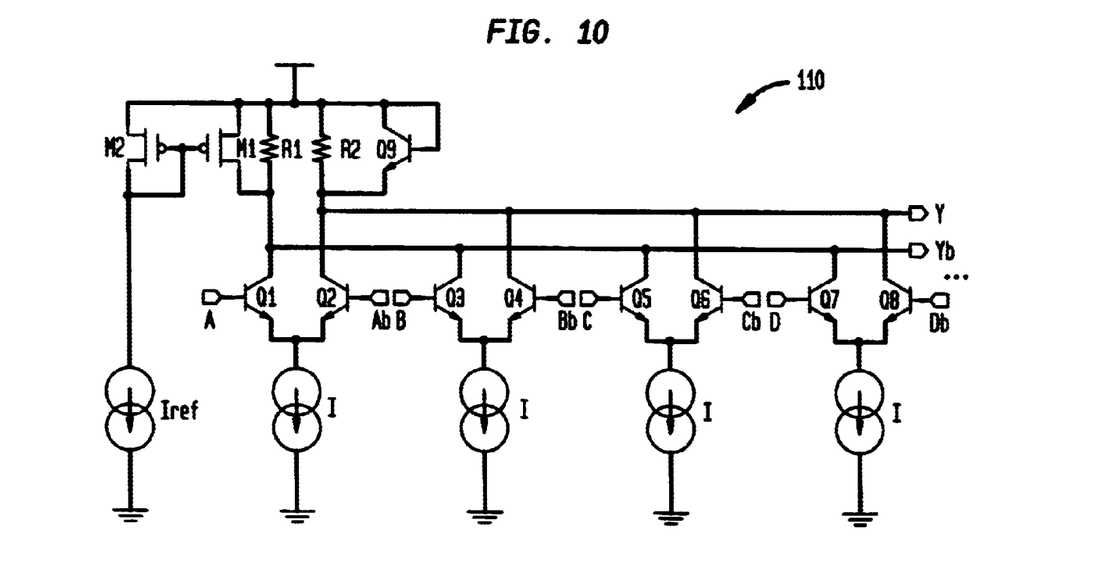
FIG. 10 illustrates a single stack bipolar logic multi-input (n>3) AND gate 110 using output clamping and equalizing current source across output resistance R1.

This principles as described herein may be expanded for a single stack bipolar logic multi-input (n>3) AND gate 110 as shown in FIG. 10. In general, for the n-input (n>3) AND (or OR) gate of FIG. 10, the values for the circuit elements R1, R2 and output clamping reference current Iref across R1 (as in FIG. 9) may be chosen as follows for the proper operation:

$R1=(1/n) \cdot R2$
$R2=((2n-1)/n) \cdot R$
$Iref=(n-1)/n \cdot I.$

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A single stack bipolar logic AND gate for low power applications comprising:

a first differential pair of transistors, each transistor of said first differential pair having base, emitter and collector terminals, a base of a first transistor of said first differential pair receiving a digital logic input signal A and a base of said second transistor of said first differential pair receiving its complementary digital logic signal $\overline{A}$, said emitters of each transistor of the first differential pair being connected at a common node to a first constant current source;

a second differential pair of transistors, each transistor of said second differential pair having base, emitter and collector terminals, a base of a first transistor of said second differential pair receiving a digital logic input signal B and a base of said second transistor of said second differential pair receiving its complementary digital logic signal $\overline{B}$, said emitters of each transistor of the second differential pair being connected at a common node to a second constant current source;

a common voltage power supply source, the collector terminal of each said first transistor of said first and second differential pair being connected to said common voltage power supply source through a first resistance and defining a complement output node of said AND gate, and the collector terminal of each said second transistor of said first and second differential pair being connected to said common voltage power supply source through a second resistance and additionally defining an output node of said AND gate, wherein said second resistance is greater than said first resistance.

2. The single stack bipolar logic AND gate as claimed in claim 1, wherein a ratio for resistance values R1/R2 is about 1/3.

3. The single stack bipolar logic AND gate as claimed in claim 1, further comprising an output series resistance at said complement output node of said AND gate, said output resistance enabling balancing of said output resistance when said output and complementary output nodes of said AND gate are connected to further logic devices.

4. The single stack bipolar logic AND gate as claimed in claim 1, further comprising first and second clamping devices connected across respective first and second resistances, said clamping devices enabling reduced voltage swings at said output and complementary output nodes of said AND gate, thereby permitting operation in low voltage applications.

5. The single stack bipolar logic AND gate system as claimed in claim 4, wherein each said first and second clamping devices comprises a p-n junction diode.

6. The single stack bipolar logic AND gate as claimed in claim 4, wherein each said first and second clamping devices comprises a Schottky diode.

7. The single stack bipolar logic AND gate as claimed in claim 4, wherein each said first and second clamping devices comprises a base-emitter junction of a bipolar transistor device.

8. The single stack bipolar logic AND gate as claimed in claim 4, wherein each said first and second clamping devices comprises gate-source junction of a CMOS transistor device.

9. The single stack bipolar logic AND gate as claimed in claim 1, wherein said first and second constant current sources source substantially equal currents.

10. A single stack bipolar logic OR gate for low power applications comprising:

a first differential pair of transistors, each transistor of said first differential pair having base, emitter and collector terminals, a base of a first transistor of said first differential pair receiving a digital logic input signal A and a base of said second transistor of said first differential pair receiving its complementary digital logic signal $\overline{A}$, said emitters of each transistor of the first differential pair being connected at a common node to a first constant current source;

a second differential pair of transistors, each transistor of said second differential pair having base, emitter and collector terminals, a base of a first transistor of said second differential pair receiving a digital logic input signal B and a base of said second transistor of said second differential pair receiving its complementary digital logic signal $\overline{B}$, said emitters of each transistor of the second differential pair being connected at a common node to a second constant current source;

a common voltage power supply source, the collector terminal of each said first transistor of said first and second differential pair being connected to said common voltage power supply source through a first resistance and defining a complement output node of said OR gate, and the collector terminal of each said second transistor of said first and second differential pair being connected to said common voltage power supply source through a second resistance and additionally defining an output node of said OR gate, wherein said first resistance is greater than said second resistance.

11. The single stack bipolar logic OR gate as claimed in claim 10, wherein a ratio for resistance values R2/R1 is about 1/3.

12. The single stack bipolar logic OR gate as claimed in claim 10, further comprising an output series resistance at said output node of said OR gate, said output resistance enabling balancing of said output resistance when said output and complementary output nodes of said OR gate are connected to further logic devices.

13. The single stack bipolar logic OR gate as claimed in claim 10, wherein said first and second constant current sources source substantially equal currents.

14. A single stack, bipolar logic n-input AND gate for low power applications comprising:

a differential pairs of transistors, each transistor of each differential pair having base, emitter and collector terminals, a base of a first transistor of each said differential pairs receiving a first digital logic input signal and a base of a second transistor of each said differential pair receiving its complementary digital logic signal, said emitter terminals of each first and second transistors of each differential pair being connected at a common node to a respective constant current source;

a common voltage power supply source, the collector terminal of each said first transistor of said n differential pairs being connected to said common voltage power supply source through a first resistance and defining a complement output node of said n-input AND gate, and the collector terminal of each said second transistor of said a differential pairs being connected to said common voltage power supply source through a second resistance and additionally defining an output node of said n-input AND gate, wherein said second resistance is greater than said first resistance.

15. The single stack, bipolar logic n-input AND gate as claimed in claim 14, wherein a ratio for resistance values R1/R2 is about 1/(2n−1).

16. The single stack, bipolar logic n-input AND gate as claimed in claim 14, further comprising an output series resistance at said complement output node of said AND gate, said output resistance enabling balancing of said output resistance when said output and complementary output nodes of said AND gate are connected to further logic devices.

17. The single stack, bipolar logic n-input AND gate as claimed in claim 14, further comprising first and second clamping devices connected across respective first and second resistances, said clamping devices enabling reduced voltage swings at said output and complementary output nodes of said n-input AND gate, thereby permitting operation in low voltage applications.

18. The single stack, bipolar logic n-input AND gate system as claimed in claim 17, wherein each said first and second clamping devices comprises a p-n junction diode.

19. The single stack, bipolar logic n-input AND gate as claimed in claim 17, wherein each said first and second clamping devices comprises a Schottky diode.

20. The single stack, bipolar logic n-input AND gate as claimed in claim 17, wherein each said first and second clamping devices comprises a base-emitter junction of a bipolar transistor device.

21. The single stack, bipolar logic n-input AND gate as claimed in claim 17, wherein each said first and second clamping devices comprises a gate-source junction of a CMOS transistor device.

22. The single stack, bipolar logic n-input AND gate as claimed in claim 17, wherein said first and second constant current sources source substantially equal currents having a value I.

23. The single stack, bipolar logic n-input AND gate as claimed in claim 22, further comprising a current source connected across said first resistance for clamping a reference current to each said first transistors of each n differential pairs.

24. The single stack, bipolar logic n-input AND gate as claimed in claim 23, wherein said current source includes a constant current source having a reference current equal in value to $((n-1)/n) \cdot I$.

25. The single stack, bipolar logic n-input AND gate as claimed in claim 23, wherein $n \geq 3$.

* * * * *